United States Patent
Park et al.

(10) Patent No.: US 8,557,617 B2
(45) Date of Patent: Oct. 15, 2013

(54) METHOD OF MANUFACTURING LIGHT EMITTING DIODE PACKAGE

(75) Inventors: Youn Gon Park, Gyunggi-Do (KR); Jong Myeon Lee, Gyunggi-Do (KR); Hai Sung Lee, Gyunggi-Do (KR); Myung Whun Chang, Seoul (KR); Ho Sung Choo, Gyunggi-Do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1758 days.

(21) Appl. No.: 11/709,130

(22) Filed: Feb. 22, 2007

(65) Prior Publication Data
US 2007/0196939 A1     Aug. 23, 2007

(30) Foreign Application Priority Data

Feb. 22, 2006 (KR) .................. 10-2006-0017390

(51) Int. Cl.
*H01L 21/00* (2006.01)
(52) U.S. Cl.
USPC ....... 438/29; 257/100; 257/E33.074; 313/502
(58) Field of Classification Search
USPC ............... 313/502, 506; 438/26, 27, 29; 257/98–100, 788, E33.059, E33.073, 257/E33.074
See application file for complete search history.

(56) References Cited

U.S. PATENT DOCUMENTS

| | | | |
|---|---|---|---|
| 6,653,765 B1 * | 11/2003 | Levinson et al. | 313/112 |
| 6,670,207 B1 * | 12/2003 | Roberts | 438/27 |
| 6,734,465 B1 * | 5/2004 | Taskar et al. | 257/80 |
| 7,279,346 B2 * | 10/2007 | Andrews et al. | 438/27 |
| 2003/0151361 A1 | 8/2003 | Ishizaka | |
| 2005/0001228 A1 * | 1/2005 | Braune et al. | 257/99 |
| 2006/0189013 A1 * | 8/2006 | Schardt et al. | 438/26 |

FOREIGN PATENT DOCUMENTS

| | | |
|---|---|---|
| JP | 2003-234509 | 8/2003 |
| JP | 2005-5679 | 1/2005 |
| JP | 2005-191197 | 7/2005 |

OTHER PUBLICATIONS

Japanese Office Action issued in Japanese Patent Application No. 2007-035692, dated Apr. 6, 2010.
Japanese Patent Court Decision, and English translation thereof, issued in Japanese Patent Application No. 2011-14014 dated Dec. 8, 2011.
Japanese Office Action, and English translation thereof, issued in Japanese Patent Application No. 2007-035692 dated Jun. 19, 2012.

* cited by examiner

*Primary Examiner* — David Vu
(74) *Attorney, Agent, or Firm* — McDermott Will & Emery LLP

(57) ABSTRACT

A method of manufacturing a light emitting diode package. A cup-shaped package structure with a recess formed therein and an electrode structure formed on a bottom of the recess is prepared. A light emitting diode chip is mounted on a bottom of the recess with a terminal of the chip electrically connected to the electrode structure. A liquid-state transparent resin is injected in the recess and before the liquid-state transparent resin is completely cured, a stamp with a micro rough pattern engraved thereon is applied on an upper surface of the resin. The liquid-state transparent resin is cured with the stamp applied thereon to form a resin encapsulant and the stamp is removed from the resin encapsulant.

10 Claims, 4 Drawing Sheets

METHOD OF MANUFACTURING LIGHT EMITTING DIODE PACKAGE

CLAIM OF PRIORITY

This application claims the benefit of Korean Patent Application No. 2006-0017390 filed on Feb. 22, 2006, in the Korean Intellectual Property Office, the disclosure of which is incorporated herein by reference.

BACKGROUND OF THE INVENTION

1. Field of the Invention

The present invention relates to a method of manufacturing a light emitting diode package and, more particularly, to a method of manufacturing a light emitting diode package which forms a micro structure for improving light extraction efficiency of a light emitting diode.

2. Description of the Related Art

A light emitting diode is a semiconductor device for converting electric energy to light energy and is composed of a compound semiconductor that generates a particular wavelength of light according to an energy band gap. Recently, light emitting diodes are utilized in various applications such as optical communication, display and the like.

Light emitting diodes are provided in packages designed in accordance with the purpose and required configuration. In general, to manufacture a light emitting diode package, a light emitting diode chip is mounted on a substrate or a lead frame with an electrode pattern formed thereon, a terminal of the chip is electrically connected to the electrode pattern (or the lead) and a resin encapsulant is formed over the chip using an epoxy, silicone or combinations thereof.

FIG. 1 illustrates an example of a conventional light emitting diode package.

Referring to FIG. 1, the light emitting diode package 10 includes a lower package substrate 11a with two electrode patterns 12a and 12b formed thereon and an upper package substrate 11b with a recess formed therein. A light emitting diode chip 15 is mounted on a bottom of the recess using an adhesive layer 14. The two electrodes (not shown) of the light emitting diode chip 15 can be connected to upper ends of the lead frames 12a and 12b by wires.

The light emitting diode chip 15 is surrounded by a resin encapsulant 16. The resin encapsulant is an important component that affects the light emission efficiency of the light emitting diode package 10. That is, the light emitted from the light emitting diode chip 15 can vary in the amount extracted to the outside depending on the optical characteristics (especially, the refractive index) and the shape of the resin encapsulant 16.

In particular, a transparent resin such as an epoxy resin or a silicone resin of the resin encapsulant 16 has a refractive index (e.g. epoxy resin: 1.5) higher than that of the external atmosphere, and thus the light amount extracted in actuality is limited by the light extraction critical angle determined thereby. Therefore, a considerable portion of light deviating from the critical angle range in the resin encapsulant 16 is internally totally reflected and not extracted to the outside or comes to have complex light paths. This results in low light extraction efficiency.

In addition, as shown in FIG. 1, when a liquid transparent resin is injected through a dispensing procedure, etc. to form the resin encapsulant 16 in the recess such as in the case of a side-view light emitting diode package, the encapsulant forms a curved surface due to the wettability of the liquid resin, which results in low light extraction efficiency.

SUMMARY OF THE INVENTION

The present invention has been made to solve the foregoing problems of the prior art and therefore an aspect of the present invention is to provide a method of manufacturing a light emitting diode package which effectively forms a micro rough pattern on an upper surface of a resin encapsulant provided in a recess of the package.

According to an aspect of the invention, the invention provides a method of manufacturing a light emitting diode package. The method includes:

preparing a cup-shaped package structure with a recess formed in an upper surface thereof and an electrode structure formed on a bottom of the recess;

mounting a light emitting diode chip on a bottom of the recess with a terminal of the light emitting diode chip electrically connected to the electrode structure;

injecting a liquid-state transparent resin in the recess of the package structure;

applying a stamp with a micro rough pattern engraved thereon, on an upper surface of the liquid-state transparent resin before the liquid-state transparent resin is completely cured;

curing the liquid-state transparent resin with the stamp applied thereto to form a resin encapsulant; and removing the stamp from the resin encapsulant.

The step of applying a stamp can be implemented after the injected liquid-state transparent resin is partially cured. In this case, the viscosity of the material and the engraved pattern of the stamp can be adjusted to easily remove the stamp from the cured resin encapsulant and minimize the possibility of damaging the rough pattern formed on the upper surface of the resin encapsulant.

Preferably, the step of injecting a liquid-state transparent resin includes injecting the liquid-state transparent resin in such an amount that the upper surface of the injected liquid-state transparent resin is higher than the upper end of the recess of the package structure. This advantageously facilitates applying the stamp on an upper part of the liquid-state transparent resin injected in the recess regardless of the size of the stamp.

In a specific embodiment of the present invention, the liquid-state transparent resin can have phosphor dispersed therein to convert the wavelength. Alternatively, the method may further include forming a phosphor film for converting the wavelength on a surface of the light emitting diode chip before forming a resin encapsulant.

It is preferable that the stamp is a planar structure with the micro rough pattern engraved on a surface thereof. Applying this planar structure of the stamp allows flattening the overall upper surface of the resin encapsulant, which is curved due to the wettability of the liquid transparent resin.

The micro rough pattern can have various forms with regular or irregular microstructural features. For example, the micro rough pattern engraved on the stamp may be composed of a plurality of triangular prisms arranged in one direction or a plurality of quadrangular pyramids arranged in lines and rows.

Preferably, the method may further include applying a release agent on a surface of the stamp that comes in contact with the transparent resin before applying the stamp in order to facilitate the process of removing the stamp from the resin.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIG. 2(a) to 2(e) are sectional views illustrating a method of manufacturing a light emitting diode package according to the present invention.

Figure 1:
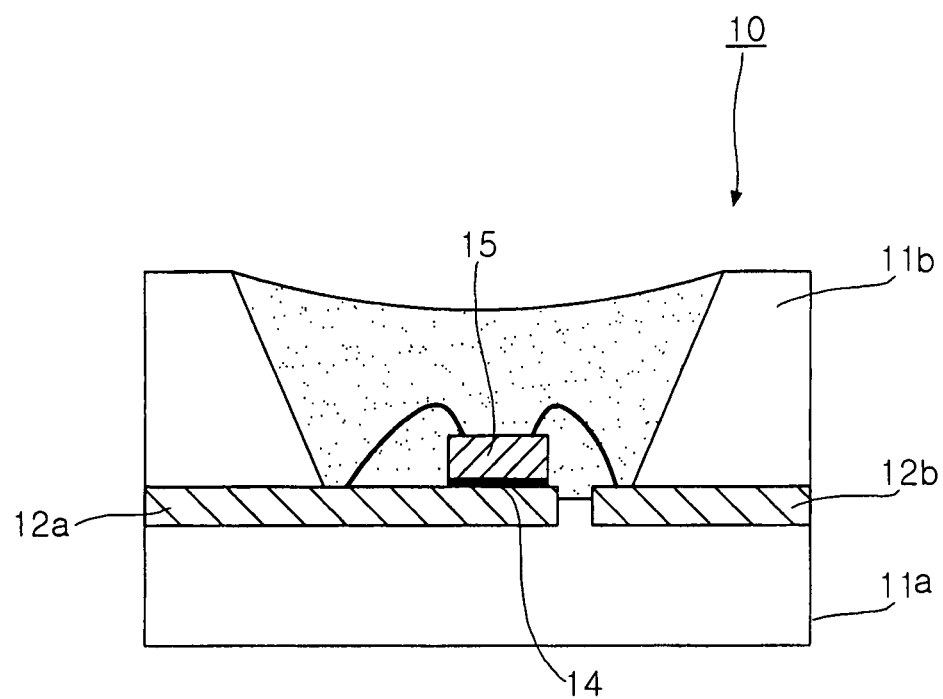
FIG. 1 is a side sectional view illustrating a conventional light emitting diode package.
Figure 2:
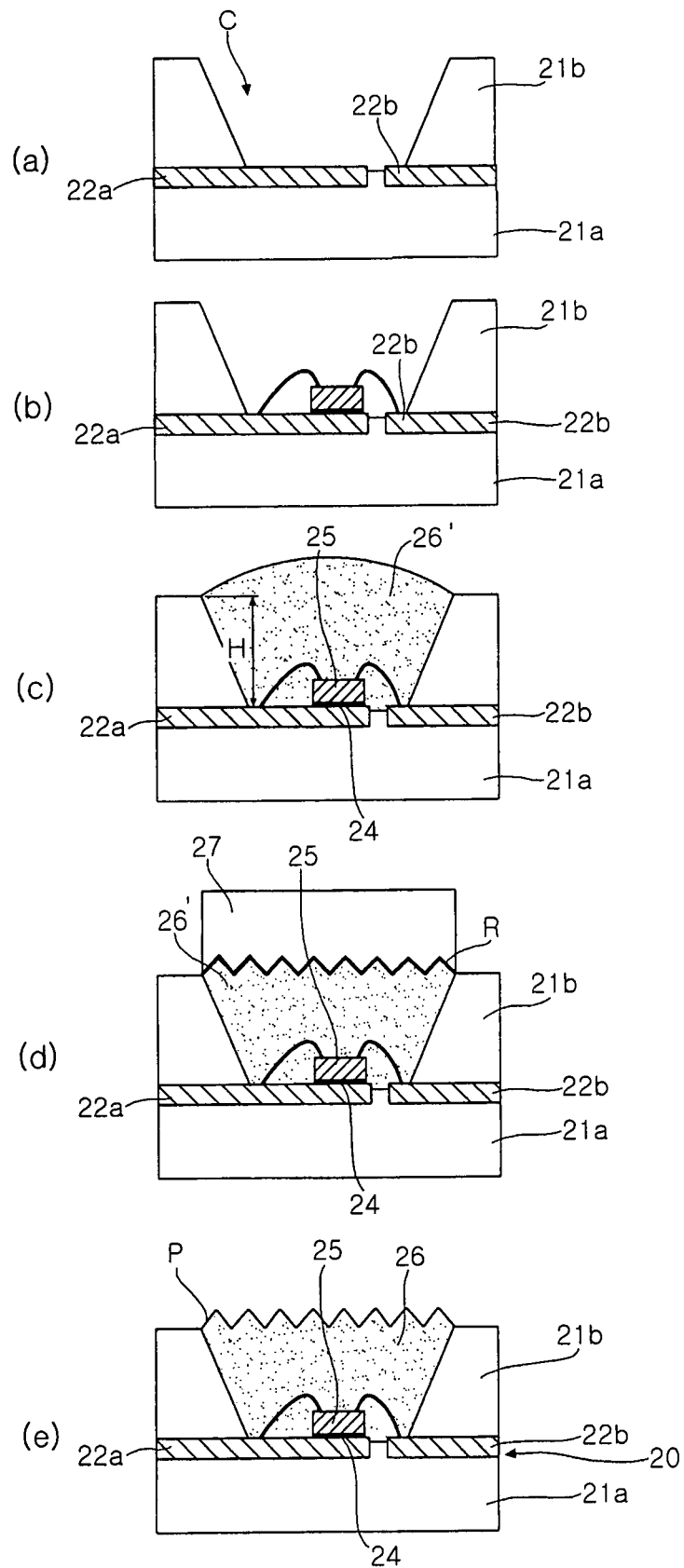
FIG. 2(a) to 2(e) are sectional views illustrating the steps of manufacturing a light emitting diode package according to an embodiment of the present invention.

First, as shown in FIG. 2(a), a cup-shaped structure 21 having a recess C and electrode patterns 22a and 22b formed at least on a bottom of the recess C is provided. The inner sidewall of the recess C can be used as an upwardly-inclined reflecting surface. The package structure 21 adopted in this embodiment exemplifies one that is composed of a lower substrate 21a having the electrode patterns 22a and 22b and an upper substrate 21b having a recess, which however does not limit the present invention. The package substrate 21 can be any other package substrate having a cup structure for mounting a chip therein. In addition, the electrode patterns 22a and 22b can be understood as an electrode structure connected to other set of electrodes through conductive vias. The electrode structure can also adopt various known structures, for example, lead frames.

Next, as shown in FIG. 2(b), a light emitting diode chip 25 is mounted on a bottom of the recess C with a terminal (not shown) thereof electrically connected to the electrode patterns 22a and 22b. Here, the light emitting diode chip 25 can be composed of a submount substrate and a light emitting diode mounted thereon. The light emitting diode chip 25 can be fixed on the substrate 21b by an adhering means 24 such as Ag epoxy resin or eutectic solder. The light emitting diode chip 25 and the electrode patterns can be connected by wires, but also can be connected by flip chip bonding.

Next, as shown in FIG. 2(c), a liquid-state transparent resin 26 is injected into the recess C of the package structure 21. The liquid-state transparent resin 26' can be a transparent resin 26' selected from the group consisting of a silicone resin, epoxy resin and mixtures thereof. The liquid-state transparent resin 26' can be injected by a known process such as a dispensing process. It is preferable to inject the liquid-state transparent resin 26' in such an amount that the upper surface of the completely injected liquid-state transparent resin 26' is a little higher than the height H of the recess. This facilitates obtaining a desired rough pattern regardless of the size of a stamp. More preferably, the liquid-state resin is injected in such an amount that the liquid-state resin does not flow over unwanted areas of the package and maintains a convex shape by surface tension. The liquid-state transparent resin 26' may have phosphor dispersed therein to convert the wavelength of light from the light emitting diode chip 25 to a different wavelength of light. Alternatively, before injecting the liquid-state transparent resin, a phosphor film (not shown) may be formed on a surface of the light emitting diode chip 25 to convert the wavelength.

Next, as shown in FIG. 2(d), a stamp 27 with a micro rough pattern engraved on a surface thereof is applied on the surface of the liquid-state resin 26' to form a rough pattern on the surface of the liquid-state resin. This process can be understood as an imprinting or stamping process. It is preferable that the stamp has a planar structure. Such a planar-structure stamp 27 serves to flatten the curved surface of the resin due to the wettability of the liquid-state resin 26', thereby preventing any adverse optical effects due to the curved surface of the resin. In addition, this process can be implemented in a partially-cured state of the resin after the resin has been cured for a predetermined time. In this case, the type of resin or the engraved pattern of the stamp 27 can be adjusted to facilitate a later process of separating the stamp from the resin. Also, to facilitate such a separation process, it is preferable to apply a release agent R on the engraved pattern surface of the stamp 27 such as silicone oil.

Finally, as shown in FIG. 2(e), the liquid-state transparent resin is cured with the stamp 27 attached thereon to form a resin encapsulant 26, and the stamp 27 is removed in such a way that the rough pattern P formed on the upper surface of the resin encapsulant 26 is not damaged. In addition, a dearation process can be implemented to remove bubbles in the liquid-state transparent resin 26' being cured with the stamp 27 attached thereon. Here, it would be apparent to the person in the art that appropriate curing time, temperature and pressure can be chosen according to the type and viscosity of the liquid-state transparent resin as the resin is cured with the stamp 27 having the engraved pattern applied thereon.

The rough pattern formed on the surface of the resin encapsulant through the above described steps can increase the light amount emitted to the outside from the light emitting diode chip, thereby providing a package with higher light emission efficiency. In addition, selecting a suitable amount of the resin and using a stamp with a planar structure allow elimination of the optically-disadvantageous curved surface of the resin encapsulant provided in the recess.

The rough pattern on the surface of the resin encapsulant can be variously fabricated corresponding to the engraved pattern of the stamp. The various patterns of the resin encapsulant formed in the rectangular parallelepiped recess are shown in FIG. 3(a) to FIG. 3(c).

Figure 3:
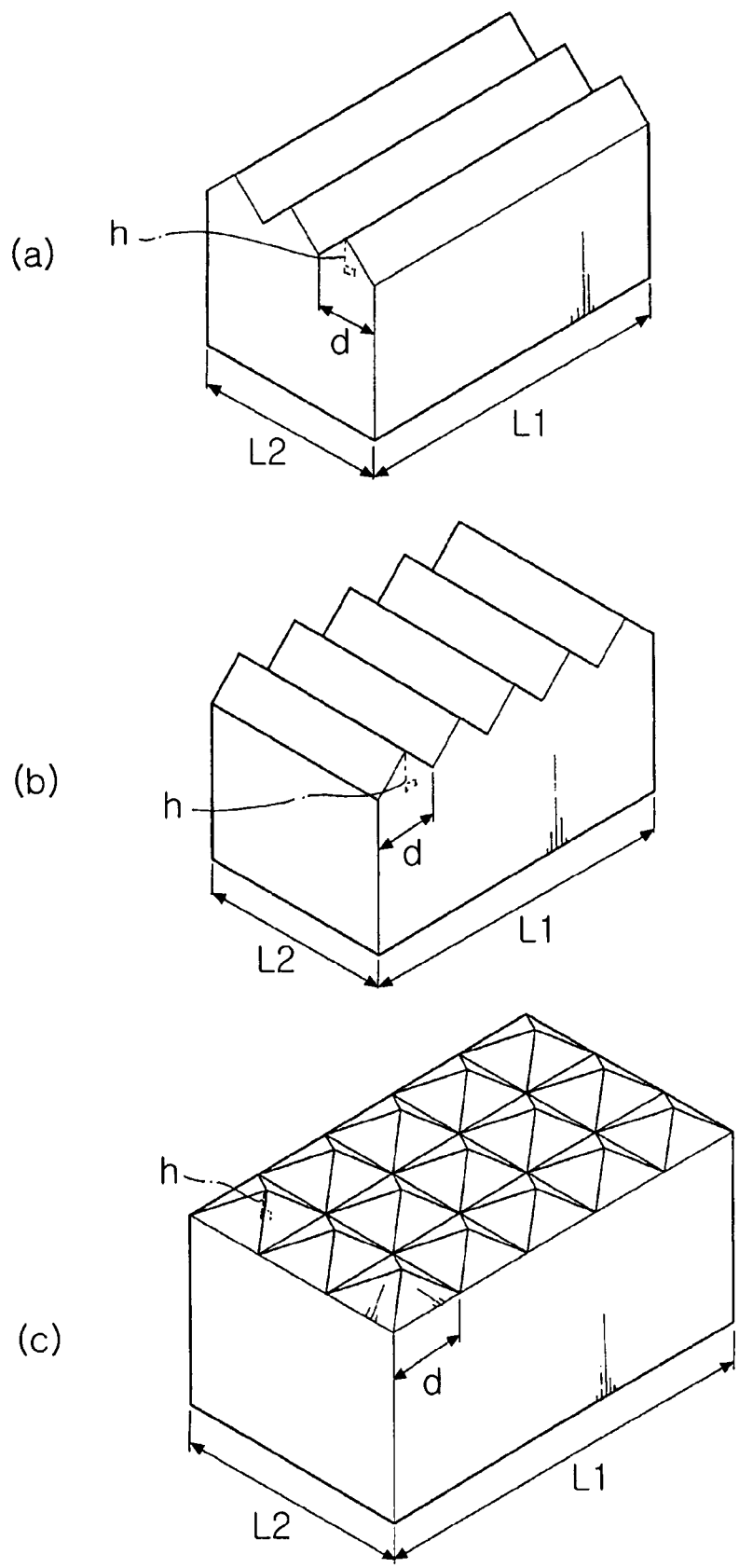
FIG. 3(a) to 3(c) are schematic perspective views illustrating various forms of rough patterns according to the present invention.

Referring to FIG. 3(a), the resin encapsulant can be configured to have a pattern with a triangular section, composed of microstructural features arranged only along the long axis L1 of the parallelepiped recess. This pattern can be formed by using a stamp with a corresponding pattern engraved thereon. Similarly, as shown in FIG. 3(b), the resin encapsulant can be configured to have a pattern with microstructural features formed only in one direction along the short axis L2 of the parallelepiped recess.

Also, as shown in FIG. 3(c), the resin encapsulant can be configured to have a plurality of quadrangular pyramids arranged along the long and short axes L1 and L2 of the parallelepiped recess, i.e., in lines and rows on the upper surface of the parallelepiped recess. The quadrangular pyramids provide relatively a large number of inclined surfaces as shown in FIG. 3(c), and thus are more advantageous than the patterns shown in FIG. 3(a) and (b). However, the patterns shown in FIG. 3(a) and (b) are more advantageous in term of preventing damage to the rough pattern while removing the stamp from the resin.

The degree of the improved light extraction efficiency can vary according to the shape of the pattern of the resin encapsulant as well as the size of each of the microstructural features. For example, the patterns with the triangular sections as shown in FIG. 3(a) to 3(c) can be suitably configured to have varying lengths of the base d or the height h of the triangular section.

Figure 4:
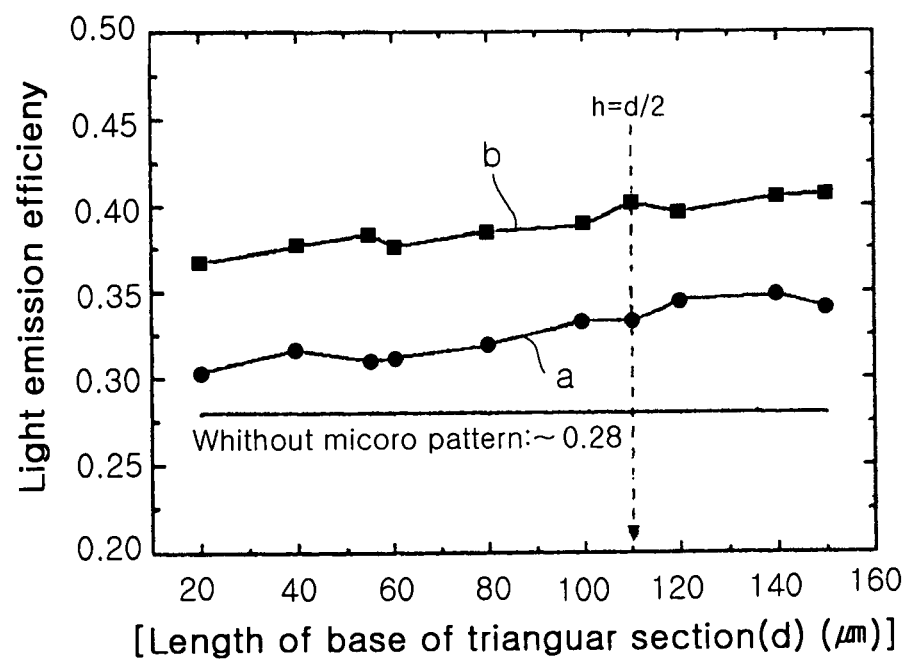
FIG. 4 is a graph illustrating an effect of improved light extraction efficiency according to an embodiment of the present invention.

FIG. 4 is a graph illustrating the improved affect of light extraction according to an embodiment of the present invention.

First, a light emitting diode package was manufactured without a rough pattern on a resin encapsulant thereof according to a conventional method (without a micro structure). Also, according to the present invention, a package a having a micro rough pattern along the long axis L1 as shown in FIG. 3(a) and a package b having a micro rough pattern along the short axis L2 as shown in FIG. 3(b) were fabricated.

Then, the light emission efficiency was measured for each of the packages. Further, as shown in the graph of FIG. 4, under the same conditions as described above, additional packages with varying sizes of the microstructural features were fabricated and measured in their respective light emission efficiency. That is, the packages were fabricated with varying lengths d of the bases of the triangular sections thereof while the heights were set ½ of the respective lengths of the bases. Then the light emission efficiency was measured for each package. The results are represented by the graph of FIG. 4.

The package without the micro pattern on the resin encapsulant exhibited very low light extraction efficiency of about 0.28 (the light emitting diode chip has light extraction efficiency of 1), whereas the package a with the rough pattern along the long axis exhibited light extraction efficiency of about 0.3 to 0.33 and the package b with the rough pattern along the short axis exhibited light emission efficiency of about 0.37 to 0.4. Therefore, the packages a and b according to the present invention exhibited about 8 to 18% and about 32 to 43% improved light emission efficiency, respectively, owing to the rough pattern structures.

Although both having the same shape of patterns, the reason that the package b with the rough pattern along the short axis has greater light emission efficiency than the package a with the rough pattern along the long axis is because a greater number of microstructural features can be formed in the package b given the same area as the package a. Therefore, in the case of two patterns geometrically combined, i.e., in the case of the quadrangular pyramids, greater improvement of the light extraction efficiency can be expected.

According to the present invention as set forth above, a rough pattern can be formed on a surface of a resin encapsulant by a simpler process in order to increase the light extraction efficiency. Furthermore, the present invention effectively remedies a curved surface of the resin encapsulant, which is due to the wettability of a liquid-state resin, thereby preventing any optically adverse factors.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting diode package comprising:
    preparing a cup-shaped package structure with a recess formed in an upper surface thereof and an electrode structure formed on a bottom of the recess;
    mounting a light emitting diode chip on a bottom of the recess with a terminal of the light emitting diode chip electrically connected to the electrode structure;
    injecting a liquid-state transparent resin into the recess of the package structure;
    curing the injected liquid-state transparent resin until the injected liquid-state transparent resin is in a partially cured state;
    applying a stamp with a micro rough pattern engraved thereon to an upper surface of the partially cured liquid-state transparent resin before the liquid-state transparent resin is completely cured;
    curing the partially cured liquid-state transparent resin with the stamp applied thereto completely to form a resin encapsulant; and
    removing the stamp from the resin encapsulant.

2. The method according to claim 1, wherein the step of injecting a liquid-state transparent resin comprises injecting the liquid-state transparent resin in such an amount that the upper surface of the injected liquid-state transparent resin is higher than the upper end of the recess of the package structure.

3. The method according to claim 2, wherein the entire upper surface of the injected liquid-state transparent resin is higher than the upper end of the recess of the package structure.

4. The method according to claim 1, wherein the liquid-state transparent resin has phosphor dispersed therein to convert the wavelength of emitted light.

5. The method according to claim 1, further comprising forming a phosphor film for converting the wavelength of emitted light on a surface of the light emitting diode chip before forming a resin encapsulant.

6. The method according to claim 1, wherein the step of forming a resin encapsulant comprises a deaeration process to remove bubbles in the liquid-state transparent resin with the stamp applied to the liquid-state transparent resin.

7. The method according to claim 1, wherein the stamp comprises a planar structure with the micro rough pattern engraved on a surface thereof.

8. The method according to claim 1, wherein the micro rough pattern engraved on the stamp comprises a plurality of triangular prisms arranged in one direction.

9. The method according to claim 1, wherein the rough pattern engraved on the stamp comprises a plurality of quadrangular pyramids arranged in lines and rows.

10. The method according to claim 1, further comprising applying a release agent on a surface of the stamp that comes in contact with the transparent resin before applying the stamp.

* * * * *